(12) United States Patent
Mizuno et al.

(10) Patent No.: US 9,773,980 B2
(45) Date of Patent: Sep. 26, 2017

(54) ORGANIC ELECTROLUMINESCENT DEVICE

(71) Applicant: KABUSHIKI KAISHA TOSHIBA, Minato-ku (JP)

(72) Inventors: Yukitami Mizuno, Tokyo (JP); Yasushi Shinjo, Kawasaki (JP); Akio Amano, Machida (JP); Tomoko Sugizaki, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 712 days.

(21) Appl. No.: 14/197,786

(22) Filed: Mar. 5, 2014

(65) Prior Publication Data

US 2014/0299853 A1    Oct. 9, 2014

(30) Foreign Application Priority Data

Apr. 5, 2013  (JP) ................................. 2013-079891

(51) Int. Cl.
*H01L 51/00* (2006.01)
*C09K 11/06* (2006.01)
(Continued)

(52) U.S. Cl.
CPC .......... *H01L 51/0036* (2013.01); *C09K 11/06* (2013.01); *H05B 33/20* (2013.01);
(Continued)

(58) Field of Classification Search
None
See application file for complete search history.

(56) References Cited

U.S. PATENT DOCUMENTS 8,580,403 B2   11/2013   Mizuno et al.
2004/0002576 A1   1/2004   Oguma et al.
(Continued)

FOREIGN PATENT DOCUMENTS

EP   1 344 788 A1   9/2003
EP   2 498 314 A1   9/2012
(Continued)

OTHER PUBLICATIONS

Extended Search Report dated Jun. 16, 2014 in European Patent Application No. 14155729.8.
(Continued)

*Primary Examiner* — Nathan T Leong
(74) *Attorney, Agent, or Firm* — Oblon, McClelland, Maier & Neustadt, L.L.P.

(57) ABSTRACT

According to one embodiment, the organic electroluminescent device includes an anode, a cathode provided apart from the anode, and a luminous layer. The luminous layer is disposed between the anode and the cathode and contains a host material and a luminous dopant. The host material includes a polymer having a skeleton represented by Formula 1 below in a repeating unit, and a number of repetitions being 20 to 10,000.

(Continued)

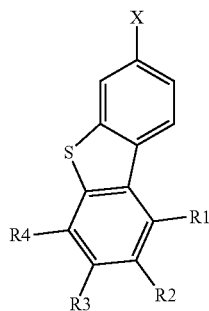

Formula 1

(X is an element composing a polymer backbone, R1, R2, R3, and R4 may be identical or different, and each of them is selected from a hydrogen atom, an alkyl group, an aromatic ring group, an alkoxy group, an alkothio group, and a halogen atom.)

17 Claims, 9 Drawing Sheets

(51) Int. Cl.
  *H05B 33/20* (2006.01)
  *H01L 51/50* (2006.01)
(52) U.S. Cl.
  CPC .. *C09K 2211/1458* (2013.01); *H01L 51/5012* (2013.01); *H01L 51/5016* (2013.01)

(56) References Cited

U.S. PATENT DOCUMENTS

2012/0228585 A1  9/2012  Mizuno et al.
2013/0032789 A1  2/2013  Hirose et al.

FOREIGN PATENT DOCUMENTS

| JP | 2011-111478 | 6/2011 |
| JP | 2012-190843 | 10/2012 |
| WO | WO 2012/004765 A2 | 1/2012 |

OTHER PUBLICATIONS

Milton L. Lee, "Synthesis of Monoamino and Monohydroxydibenzothiophenes", J. Heterocyclic Chem., vol. 22, 1985, 4 pages.
Osamu Shimomura, et al., "Synthesis and Radical Polymerization of 2-Vinyldibenzothiophene", Journal of Polymer Science: Part A: Polymer Chemistry, vol. 35, 1997, 7 pages.

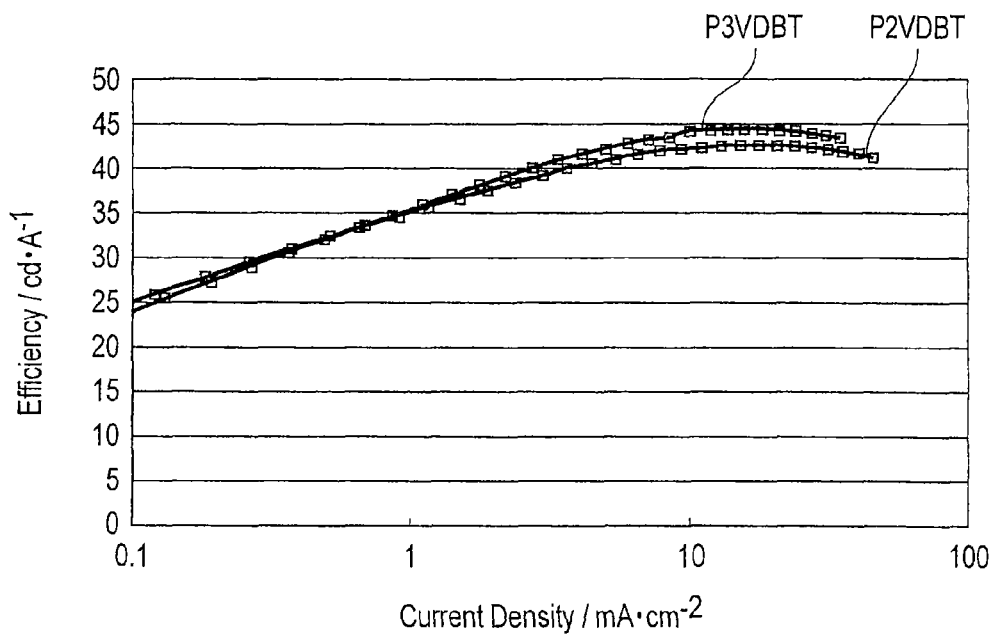
F I G. 3
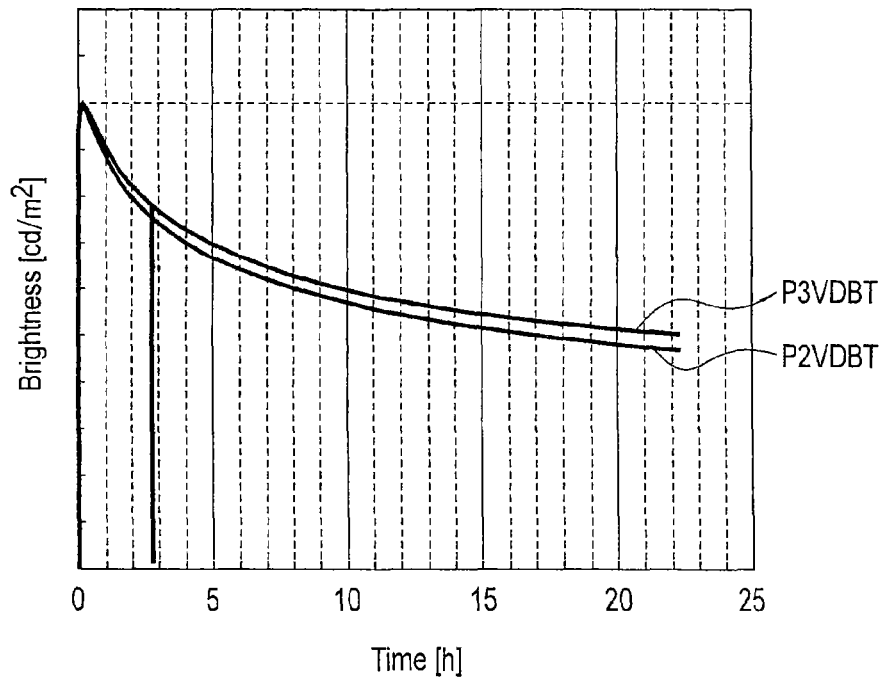
F I G. 4

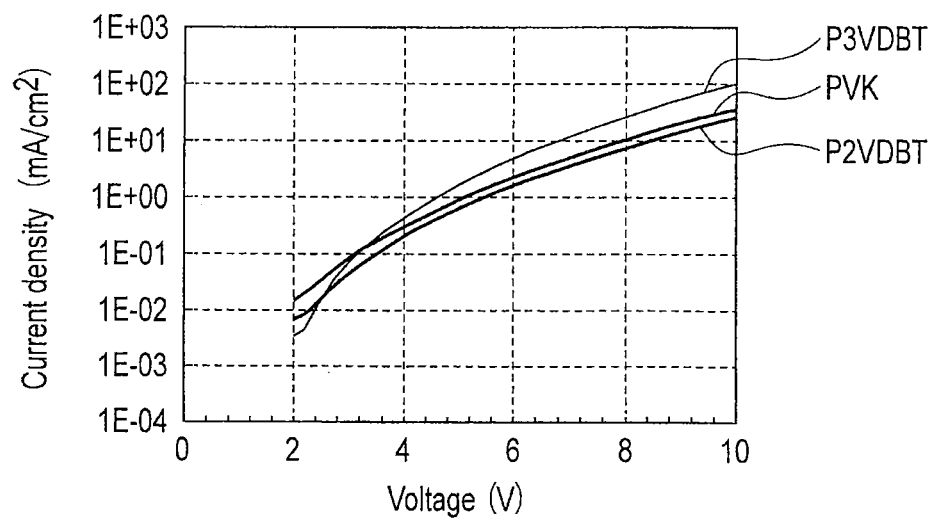
F I G. 5
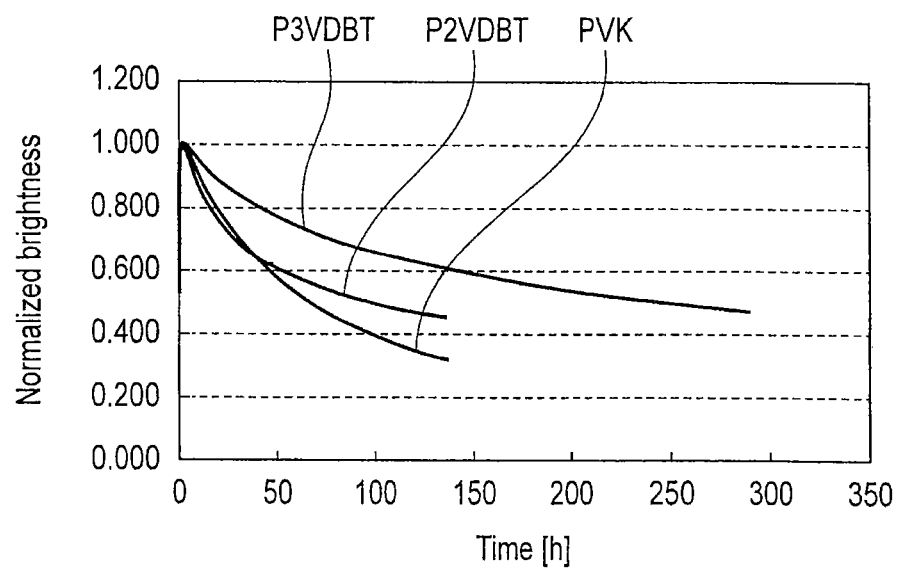
F I G. 6

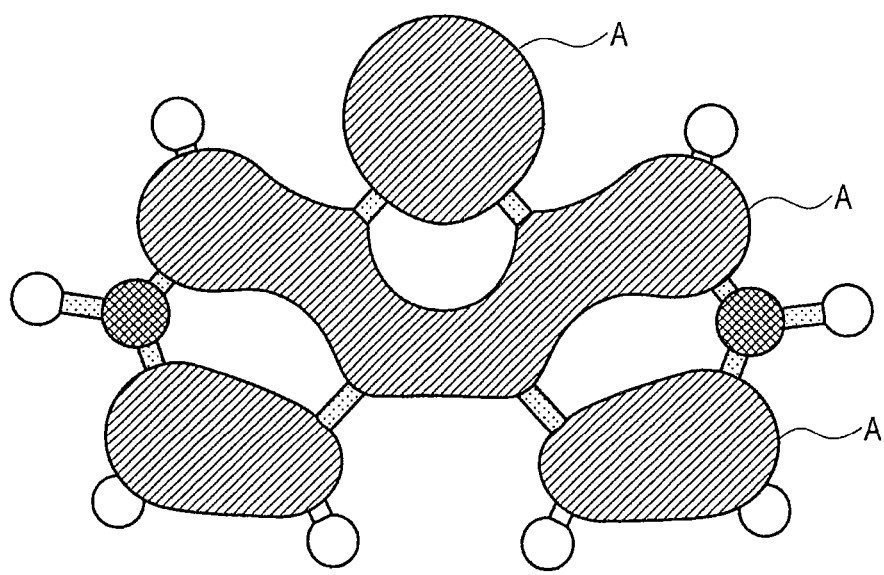
F I G. 7A
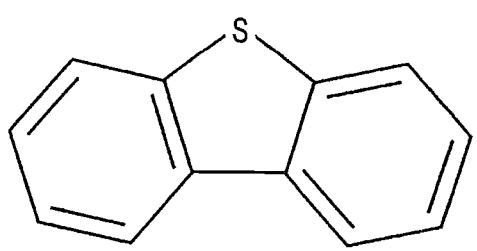
F I G. 7B

ORGANIC ELECTROLUMINESCENT DEVICE

CROSS-REFERENCE TO RELATED APPLICATIONS

This application is based upon and claims the benefit of priority from Japanese Patent Application No. 2013-079891 filed Apr. 5, 2013; the entire contents of which are incorporated herein by reference.

FIELD

The embodiment described herein generally relates to an organic electroluminescent device, an illumination apparatus, a display, and an organic electroluminescent device material.

BACKGROUND

In recent years, organic electroluminescent devices (hereinafter also referred to as organic EL devices) are attracting attention as a luminescence technique for next generation displays and illumination.

When a polymer material is used as the host material, passage of an electric charge through the polymer material can cause deterioration of the material by various mechanisms, such as the decomposition of the material itself, or side reaction of the material to become another substance. Under these circumstances, there is a demand for host materials resistant to deterioration under electric charges.

BRIEF DESCRIPTION OF THE DRAWINGS

FIG. 3 shows the relationship between the current density and luminous efficiency of the organic electroluminescent devices;

FIG. 4 shows the relationship between the luminous time and brightness of the organic electroluminescent devices;

FIG. 5 shows the relationship between the current density and voltage of the organic electroluminescent devices;

FIG. 6 shows the relationship between the luminous time and brightness of the organic electroluminescent devices;

FIG. 7A shows the result of the molecular orbital calculation of dibenzothiophene;

FIG. 7B shows the structure of the dibenzothiophene molecule corresponding to FIG. 7A;

DETAILED DESCRIPTION

Figure 1:
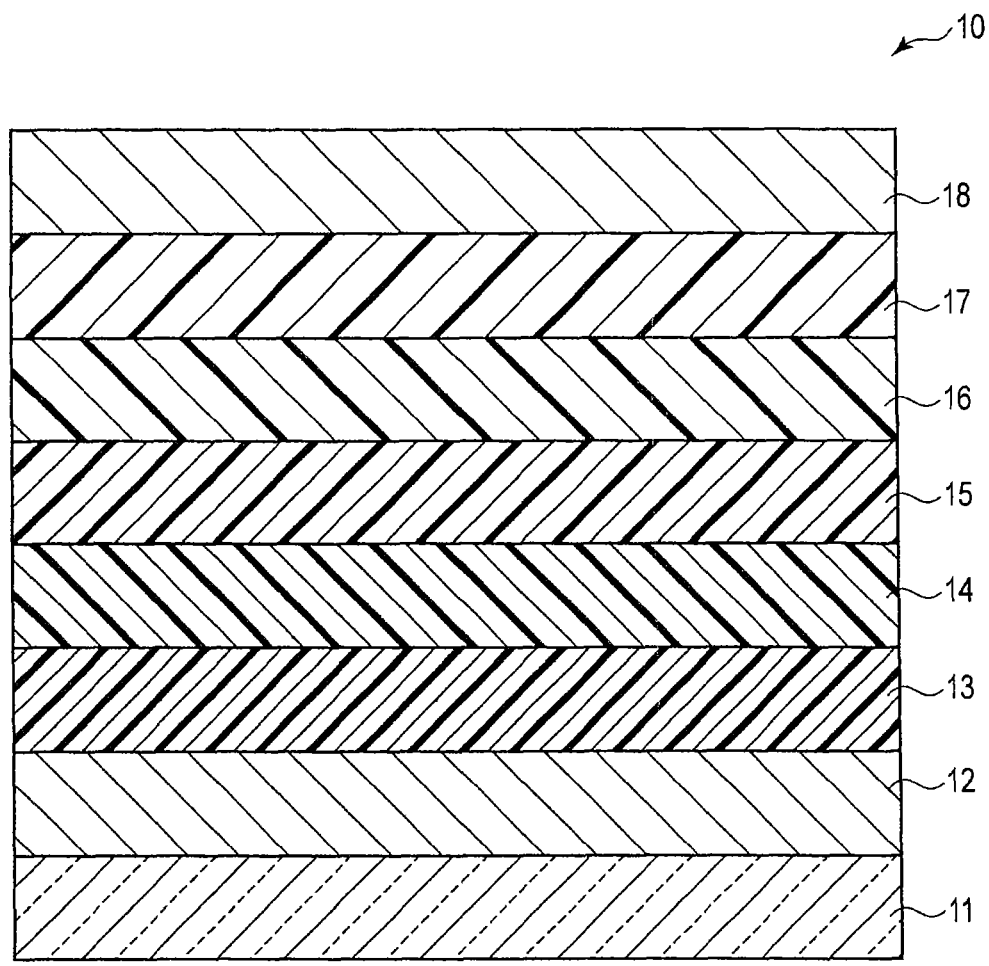
FIG. 1 is a cross sectional view showing the organic electroluminescent device.

According to one embodiment, the organic electroluminescent device includes an anode, a cathode provided apart from the anode, and a luminous layer. The luminous layer is disposed between the anode and cathode and contains a host material and a luminescent dopant. The host material contains a polymer having the skeleton represented by Formula 1 below in a repeating unit, and a number of repetitions being 20 to 10,000:

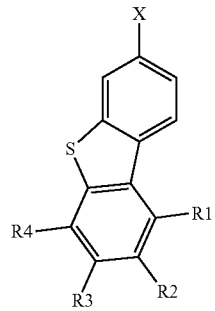

Formula 1 wherein X is an element composing a polymer backbone, R1, R2, R3, and R4 may be identical or different, and each of them is selected from the group consisting of a hydrogen atom, an alkyl group, an aromatic ring group, an alkoxy group, an alkothio group, and a halogen atom.

The embodiments of the present invention are described below in detail with reference to the drawings.

The drawings are schematic or conceptualistic, so that the relationship between the thickness and width of the respective parts, and ratio between the parts may be not the same as actual ones. In addition, even when the same parts are shown, the dimensions and ratios may differ among the drawings.

In the present description and figures, the same elements as those in the previous figures are indicated by the same reference numerals, and detailed explanations thereof are omitted as appropriate.

(First Embodiment)

FIG. 1 is a cross sectional view showing the organic electroluminescent device according to the first embodiment.

An organic electroluminescent device 10 includes an anode 12, a cathode 18, and a luminous layer 15 between the anode 12 and cathode 18.

The organic electroluminescent device 10 may further include a substrate 11, a hole injection layer 13, a hole transporting layer 14, an electron transporting layer 16, and an electron injection layer 17. The anode 12 is formed on the substrate 11. The hole injection layer 13 is formed between the anode 12 and the luminous layer 15. The hole transporting layer 14 is formed between the hole injection layer 13 and the luminous layer 15. The electron transporting layer 16 is formed between the cathode 18 and the luminous layer 15. The electron injection layer 17 is formed between the electron transporting layer 16 and the cathode 18. The hole injection layer 13 and/or the hole transporting layer 14 may be omitted. The electron transporting layer 16 and/or the electron injection layer 17 may be omitted.

The luminous layer 15 includes a host material and a luminescent material. The luminous layer 15 receives holes from the anode 12 side, and receives electrons from the cathode 18 side. The holes and electrons are recombined in the luminous layer 15. The energy caused by the recombination excites the host material in the luminous layer 15. As a result of the energy transfer from the excited host material to the luminescent dopant (the luminous material), the luminescent dopant is excited, and luminescence occurs when the luminescent dopant returns to the ground state.

Alternatively, the energy caused by the recombination excites the luminescent material and the luminous material and luminescence occurs when the luminous material returns to the ground state.

The luminous layer 15 is, for example, a host material made of an organic material doped with a luminescent material (hereinafter referred to as luminescent dopant). In the present embodiment, the host material is a material including the polymer containing the dibenzothiophene skeleton represented by the following Formula 1 as a repeating unit.

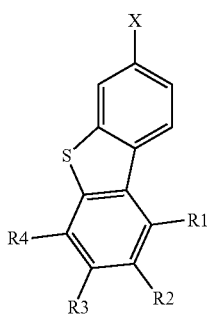

Formula 1

In the Formula 1, the atom X is an atom composing the polymer backbone, and is, for example, carbon. More specifically, the host material has a structure wherein the atom X in the polymer backbone is linked to the 3-position of dibenzothiophene. In the polymer represented by the Formula 1, dibenzothiophene is a side chain. R1 to R4 may be identical or different. Each of R1 to R4 is selected from a hydrogen atom, an alkyl group, an aromatic ring group, an alkoxy group, an alkothio group, and a halogen atom.

The alkyl group may be linear, branched, or cyclic. The alkyl group preferably has 1 to 10 carbon atoms, and more preferably 1 to 6 carbon atoms. Examples of the alkyl group include a methyl group, an isopropyl group, and a cyclohexyl group. The aromatic ring group may be substituted. For example, the aromatic ring group preferably has 1 to 6 carbon atoms. The aromatic ring group is selected from, for example, a phenyl group, a naphthyl group, and a phenoxy group. The substituent is selected from, for example, a halogen atom and a carboxyl group.

For example, R1 to R4 may be hydrogen atoms.

The polymer backbone is, for example, polyvinyl or polyoxetane. When the backbone is polyvinyl, the polymer is represented by the following Formula 2.

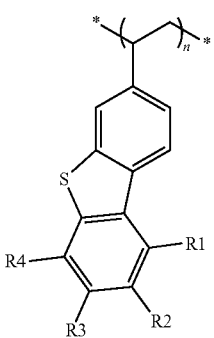

Formula 2

The number n of repetitions of the polymer is 20 to 10,000, more preferably 100 to 5,000 or less. If the n is less than 20, the compound is generally scarcely defined as a polymer. If the luminous layer 15 is formed using such a compound by a coating method, the film-forming ability is not good. On the other hand, if the n is greater than 10,000, the host material is poorly soluble in the solvent, which makes it difficult to form the luminous layer 15 by a coating method. The polymer represented by the Formula 1 particularly preferably has a number-average molecular weight of 20,000 to 1,000,000.

The polymer having the repeating unit represented by the Formula 1 is scarcely deteriorated by the passage of an electric charge therethrough. Accordingly, as a result of the use of the compound having the repeating unit represented by the Formula 1 as the host material, an organic electroluminescent device having a longer life than the conventional one is obtained.

When the same amounts of current are passed through a conventional device and an organic electroluminescent device which includes the polymer having the repeating unit represented by the Formula 1 as the host material, the latter device will achieve a higher luminous efficiency and higher brightness.

The polymer having the repeating unit represented by the Formula 1 may be, for example, the polymer having the repeating unit represented by the Formula 3.

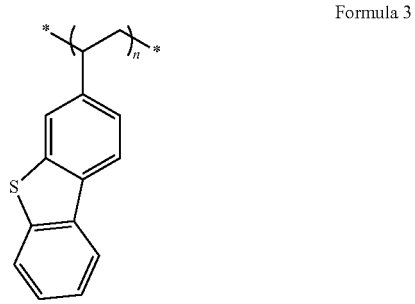

Formula 3

The polymer represented by the Formula 3 is referred to as poly(3-vinyldibenzothiophene) (P3VDPT).

More specifically, the polymer represented by the Formula 3 has a polyvinyl backbone. In the repeating unit of the polymer represented by the Formula 3, the carbon atom of the vinyl group is linked to the 3-position of dibenzothiophene. The polymer represented by the Formula 3 is the polymer represented by the Formula 1 wherein R1 to R4 are hydrogen atoms. The n represents the number of repetitions of the above-described repeating unit.

The luminescent dopant may be selected from various luminescent dopants which are known in the art. The luminescent dopant may be a luminescent metal complex. Examples of the luminescent metal complex include luminescent metal complexes containing iridium or platinum as the central metal. The luminescent dopant may be a phosphorescent dopant or fluorescent dopant. Examples of the luminescent dopant include, but are not limited to, the compounds expressed by the following Formulae 4 to 8.

Formula 4

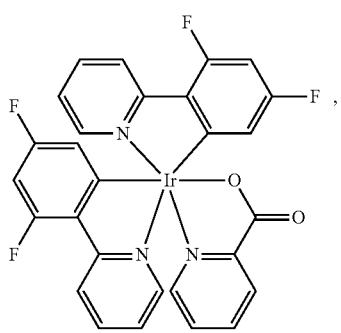

Formula 5

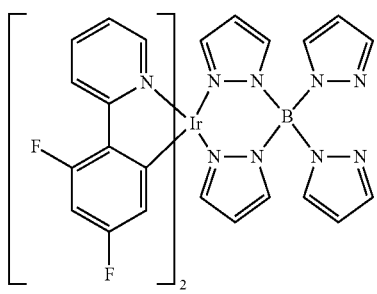

Formula 6

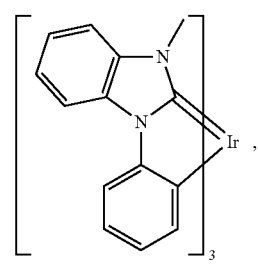

Formula 7

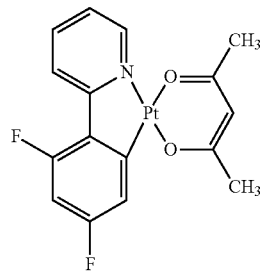

Formula 8

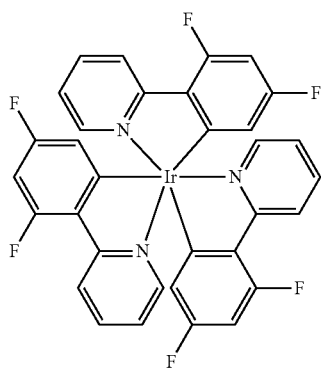

The compound represented by the Formula 4 is FIrpic (iridium(III)bis(4,6-di-fluorophenyl)-pyridinate-N,C2'-picolinate). The compound represented by the Formula 5 is FIr6(bis(2,4-difluorophenylpyridinate)-tetrakis(1-pyrazolyl) borate-iridium (III)). The compound represented by the Formula 6 is Fac-iridium (III) tris(1-phenyl-3-methylbenzimidazolin-2-indene-C,C2'). The compound represented by the Formula 7 is platinum (III)[2(4,6-difluorophenyl)pyridinate-N—C2]-(acetylacetonate). The compound represented by the Formula 8 is tris(2-(2,4-difluorophenyl)pyridine) iridium (III).

The thickness of the luminous layer 15 is preferably 10 to 100 nm. The host material and the luminescent dopant in the luminous layer 15 may be at any ratio. The luminous layer 15 may further include an electron-transporting material or a hole-transporting material, thereby adjusting a carrier balance between the holes and electrons in the luminous layer 15, and improving the luminous efficiency of the organic electroluminescent device 10.

The anode 12 injects holes into the luminous layer 15. The material of the anode 12 is not particularly limited as long as it has electrical conductivity. The anode 12 may be made of, for example, a light-transmissive conductive material having optical transparency. The anode 12 may be, for example, a conductive metal oxide film or a light-transmissive metal thin film. Specific examples of the anode 12 include films (for example, MESA) made of conductive glass including indium oxide, zinc oxide, tin oxide, and their composites such as indium tin oxide (ITO), fluorine dope tin oxide (FTO), and indium zinc oxide; and gold, platinum, silver, copper and their alloys. In particular, a transparent electrode made of ITO is preferred.

Alternatively, the anode 12 may be an organic conductive polymer. Examples of the anode 12 include polyaniline and its derivatives, polythiophene and its derivatives. When the anode 12 is ITO, the thickness is preferably 30 to 300 nm. If the thickness is less than 30 nm, electrical conductivity decreases and resistance increases, which result in a decrease in the luminous efficiency of the organic electroluminescent device 10. If the thickness is more than 300 nm, ITO loses its flexibility, and the anode 12 tends to be cracked when subjected to stress.

The anode 12 may be a single layer, or multiple layers made of materials having different work functions.

The cathode 18 injects electrons into the luminous layer 15. The cathode 18 may be, for example, a light-transmissive conductive material. The cathode 18 may be a conductive metal oxide film or a metal thin film. When the anode 12 is made of a material having a high work function, the cathode 18 is preferably made of a material having a low work function. Examples of the material having a low work function include an alkali metal and alkaline earth metal. Specific examples of the material having a low work function include Li, In, Al, Ca, Mg, Li, Na, K, Yb, and Cs.

The cathode 18 may be a single layer, or multiple layers made of materials having different work functions. In addition, two or more metallic alloys may be used. Examples of the alloy include a lithium-aluminum alloy, a lithium-magnesium alloy, a lithium-indium alloy, a magnesium-silver alloy, a magnesium-indium alloy, a magnesium-aluminum alloy, an indium-silver alloy, and a calcium-aluminum alloy.

The thickness of the cathode 18 is preferably from 10 to 300 nm. If the thickness is less than 10 nm, resistance increases too much. If the thickness is more than 300 nm, film formation of the cathode 18 takes a long time, so that the adjacent layer is damaged, which results in a deterioration in performance.

The substrate 11 supports other members. The substrate 11 is preferably not deteriorated by heat or any organic solvent. Examples of the material of the substrate 11 include inorganic materials such as non-alkali glass and quartz glass, plastics such as polyethylene, polyethylene terephthalate (PET), polyethylene naphthalate (PEN), polyimide, polyamide, polyamide imide, liquid crystal polymers, and cycloolefin polymers, polymer films, and metal substrates such as stainless steel (SUS) and silicon. The use of a transparent substrate made of, for example, glass or a synthetic resin is preferred, to better display the luminescence. The shape, structure, and size of the substrate 11 are not particularly limited, and may be appropriately selected according to the intended use.

The hole injection layer 13 receives holes from the anode 12, and injects them into the hole transporting layer 14. Examples of the material of the hole injection layer 13 include, but are not limited to, polythiophene polymers such as poly(ethylene dioxythiophene):poly(styrene sulfonate) (hereinafter referred to as PEDPT:PSS) which is a conductive ink.

The hole transporting layer 14 receives holes from the hole injection layer 13, and injects the holes into the luminous layer 15. Examples of the material of the hole transporting layer 14 include, but are not limited to, polymers composed of triphenylamine. The polymer represented by the Formula 1 used as the host material of the luminous layer 15 may be used as the material of the hole transporting layer 14.

The electron injection layer 17 receives electrons from the cathode 18, and injects them into the electron transporting layer 16. Examples of the material of the electron injection layer 17 include, but are not limited to, CsF and LiF.

The electron transporting layer 16 receives electrons from the electron injection layer 17, and transports the electrons to the luminous layer 15. Examples of the material of the electron transporting layer 16 include, but are not limited to, tris[3-(3-pyridyl)-mesityl]borane (3TPYMB), tris(8-hydroxyquinolinato)aluminum complex (Alq3), and bathophenanthroline (BPhen). The polymer having the repeating unit represented by the Formula 1 used as the host material of the luminous layer 15 may be used as the material of the electron transporting layer 16.

In FIG. 1, the anode 12 is disposed between the substrate 11 and the cathode 18. Alternatively, the cathode 18 may be disposed between the substrate 11 and the anode 12.

EXAMPLE

Figure 2:
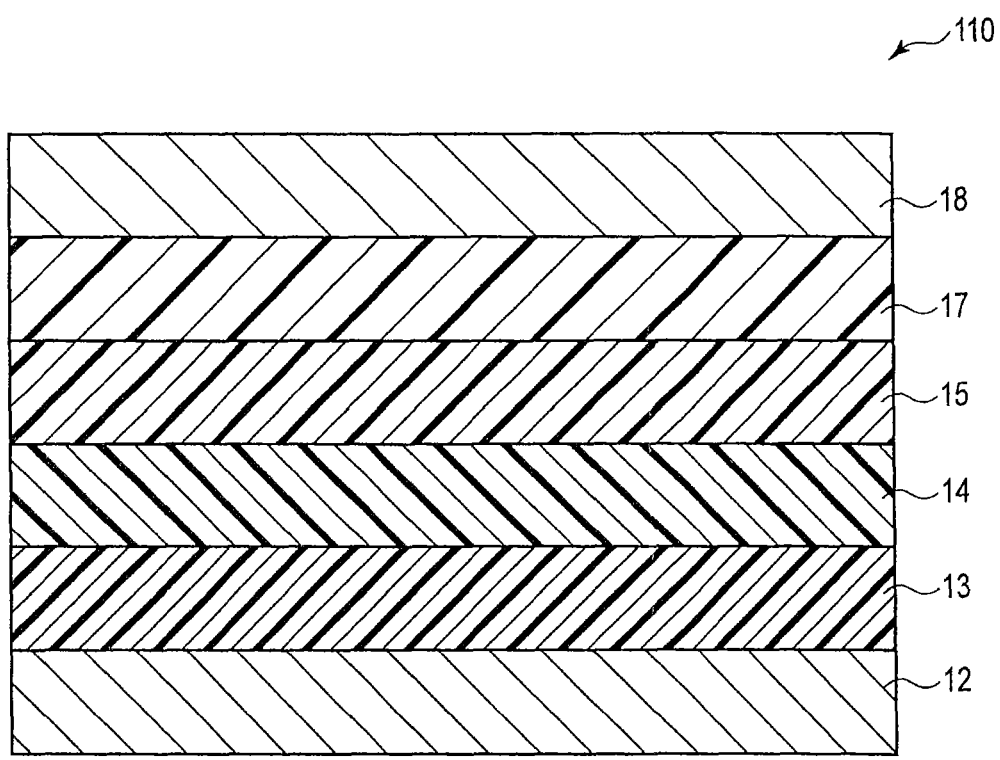
FIG. 2 is a cross sectional view showing the organic electroluminescent device according to the Example.

FIG. 2 is a cross sectional view showing the organic electroluminescent device according to Example.

An organic electroluminescent device 110 was made using P3VDBT as the host material in the luminous layer 15. The organic electroluminescent device 110 includes the anode 12, the hole injection layer 13, the hole transporting layer 14, the luminous layer 15, the electron injection layer 17, and the cathode 18. The layer structure of the organic electroluminescent device 110 is as follows:

ITO 100 nm/PEDOD:PSS 50 nm/IL001 20 nm/P3VDBT: TG001 80 nm/CsF 0.5 nm/Al 150 nm.

The anode 12 was a transparent electrode made of ITO (indium tin oxide) having a thickness of 100 nm.

The hole injection layer 13 was obtained by applying the aqueous solution of PEDOT:PSS, which is a conductive ink, by spin coating to the anode 12, and heating and drying the coating. The thickness of the hole injection layer 13 was 50 nm.

The hole transporting layer 14 was formed using a solution prepared by dissolving a triphenylamine material in xylene as the solvent. The solution was applied to the hole injection layer 13 by spin coating, and heated and dried to obtain a hole transporting layer having a thickness of 50 nm.

The luminous layer 15 was formed using a green luminescent material as the luminescent dopant, P3VDBT as the host material, and further an electron-transporting material. The P3VDBT, luminescent dopant, and electron-transporting material were weighed to make the weight ratio 2:1:2, and were dissolved into chlorobenzene to make a solution, and the solution was applied to the hole transporting layer 14 by spin coating, and heated and dried to obtain a luminous layer having a thickness of 80 nm.

The electron injection layer 17 was CsF having a thickness of 0.5 nm.

The cathode 18 was Al having a thickness of 150 nm.

REFERENCE EXAMPLE 1

An organic electroluminescent device was made in the same manner as in the Example, except that poly(2-vinyldibenzothiophene) (P2VDBT), which is a polymer having the repeating unit represented by the Formula 9, was used in place of P3VDBT as the host material of the luminous layer 15. The number average molecular weight of P2VDBT was about 20,000.

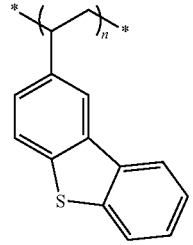

Formula 9

TEST EXAMPLE 1

Comparison of Luminescence Properties

The organic electroluminescent devices according to Example and Reference Example 1 were examined for the relationship between the current density and luminous efficiency. FIG. 3 shows the relationship between the current density and luminous efficiency of the organic electroluminescent devices according to the Example and Reference Example 1. The ordinate is the luminous efficiency (cd·A), and the abscissa is the current density (mA·cm$^{-2}$). The luminous efficiency was measured using a quantum efficiency measurement system C9920-12 (Hamamatsu Photonics K.K.) which carries out the measurement of the amount of luminescence by an integrating sphere and the measurement of the applied current and voltage simultaneously.

When the density of the electric charge applied to the organic electroluminescent device 110 according to Example and the organic electroluminescent device according to Reference Example 1 are equal, the organic electroluminescent device 110 according to the Example achieved a higher luminous efficiency under a high current density. More specifically, the organic electroluminescent device 110 according to the Example has a high brightness.

TEST EXAMPLE 2

Comparison of Device Life

The device lives of the organic electroluminescent devices according to Example and Reference Example 1 were compared. FIG. 4 shows the relationship between the luminous time and brightness of the organic electroluminescent devices according to the Example and Reference Example 1. The ordinate is brightness (cd/m$^2$), and the abscissa is luminous time (hours). The brightness was measured using an Si diode S7610 equipped with a visual sensitivity filter (Hamamatsu Photonics K.K.).

The organic electroluminescent devices according to the Example and Reference Example 1 were subjected to continuous electrification at an initial brightness of 4000 cd/m$^2$. The time required to reach half the initial brightness (4000 cd/m$^2$) was 16.6 hours for the organic electroluminescent device according to Reference Example 1, and 22.1 hours for the organic electroluminescent device 110 according to the Example. More specifically, the life of the organic electroluminescent device 110 according to the Example was about 1.3 times that of the organic electroluminescent device according to Reference Example 1. This result indicates that P3VDBT is more resistant to deterioration caused by the flow of electric charge than P2VDBT, so that the use of P3VDBT as the host material allows to obtain a long life organic electroluminescent device.

REFERENCE EXAMPLE 2

An organic electroluminescent device was made in the same manner as in the Example, except that polyvinylcarbazole (PVK), which is a polymer having the repeating unit represented by the Formula 10, was used in place of P3VDBT as the host material of the luminous layer 15. The number average molecular weight of P2VDBT was about 20,000 or more.

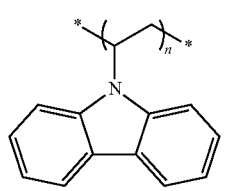

Formula 10

TEST EXAMPLE 3

Comparison of Luminescence Properties

The organic electroluminescent device according to the Example and Reference Examples 1 and 2 were examined for the relationship between the current density and voltage. FIG. 5 shows the relationship between the current density and voltage of the organic electroluminescent devices according to the Example and Reference Examples 1 and 2. The ordinate is current density (mA·cm$^{-2}$), and the abscissa is voltage (V).

When the same voltage is applied to the organic electroluminescent device 110 according to the Example and the organic electroluminescent devices according to Reference Examples 1 and 2, the organic electroluminescent device 110 according to the Example shows the highest current density. More specifically, an electric current readily passes through the organic electroluminescent device 110 according to the Example.

TEST EXAMPLE 4

Comparison of Device Life

The device lives of the organic electroluminescent device according to the Example and Reference Examples 1 and 2 were compared. FIG. 6 shows the relationship between the luminous time and brightness of the organic electroluminescent devices according to the Example and Reference Examples 1 and 2. The ordinate is brightness (cd/m$^2$), and the abscissa is luminous time (hours). The brightness on the ordinate is normalized, taking the initial brightness of the respective organic electroluminescent devices continuously driven under a voltage of 0.72 mA as 1. The brightness was measured using an Si photodiode S7610 equipped with a visual sensitivity filter (Hamamatsu Photonics K.K.).

The time required to reach half the initial brightness was 95 hours for the organic electroluminescent device according to Reference Example 1, 66 hours for the organic electroluminescent device according to Reference Example 2, and 241 hours for the organic electroluminescent device 110 according to the Example. More specifically, the life of the organic electroluminescent device 110 according to the Example was about 1.3 times that of the organic electroluminescent device according to Reference Example 1. This result indicates that P3VDBT is more resistant to deterioration caused by the flow of electric charge than P2VDBT and PVK, so that the use of P3VDBT as the host material allows to obtain a long life organic electroluminescent device.

As shown by Test Examples 1 to 4, P3VDBT is more resistant to deterioration caused by the flow of electric charge, and the organic electroluminescent device including P3VDBT as the host material has a long life and high brightness.

In the prior art, PVK was used as the host material of the luminous layer of an organic electroluminescent device. However, there is a problem that PVK is susceptible to deterioration. In addition, PVK is resistant to electric charge flow, and thus requires the application of a high voltage for passing an electric charge therethrough.

The reason for this is likely that the C—N bond contained in PVK is readily cleaved. On the other hand, P3VDBT contains no C—N bond in the dibenzothiophene. This is likely the reason for the resistance of P3VDBT to deterioration, and the long life of the organic electroluminescent device 110 using the polymer as the host material.

For comparison between P3VDBT and P2VDBT, the molecular orbital calculation of dibenzothiophene was carried out. FIG. 7A shows the HOMO energy of a dibenzothiophene molecule, wherein the areas having a high electron density are indicated with A. FIG. 7B shows the structure of the dibenzothiophene molecule corresponding to FIG. 7A. As shown in FIG. 7A, the electron density is high on the 2-position carbon atom of the dibenzothiophene molecule, and the electron density is low on the 3-position carbon atom. Accordingly, the 2-position carbon atom of the dibenzothiophene molecule has high reactivity for other molecules, and the 3-position carbon atom has low reactivity for other molecules.

From the above results, in P2VDBT, the 2-position carbon atom of the dibenzothiophene molecule is linked to the polymer backbone, so that the bond is easily cleaved between the polymer backbone and dibenzothiophene. On the other hand, in P3VDBT, the 3-position carbon atom of the dibenzothiophene molecule is linked to the polymer backbone, so that the bond is resistant to cleavage between the polymer backbone and dibenzothiophene.

The polymer having the repeating unit represented by the Formula 1 also contains no C—N bond in its side chain. In addition, in the polymer having the repeating unit represented by the Formula 1, the 3-position carbon atom of dibenzothiophene is linked to the backbone. Accordingly, the polymer having the repeating unit represented by the Formula 1 is resistant to deterioration, and the organic electroluminescent device including the polymer as the host material has a long life and high brightness.

Examples of the polymer contained in the polymer having the repeating unit represented by the Formula 1 include the polymers represented by the Formulae 11 to 15.

Formula 11

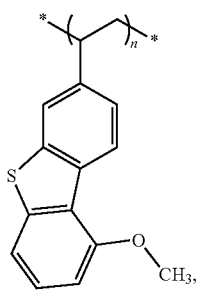

Formula 12

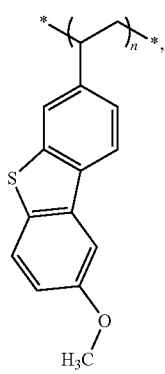

Formula 13

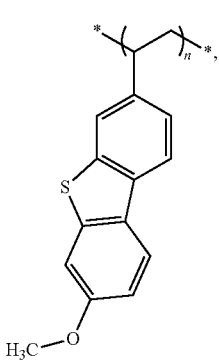

Formula 14

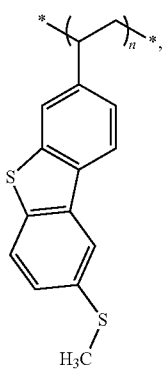

Formula 15

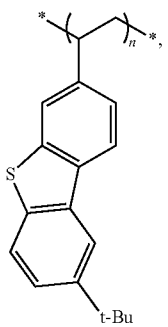

The polymer represented by the Formula 11 is that represented by the Formula 1 wherein R2, R3, and R4 are hydrogen atoms, and R1 is a methoxy group. The polymer represented by the Formula 12 is that represented by the Formula 1 wherein R1, R3, and R4 are hydrogen atoms, and R2 is a methoxy group. The polymer represented by the Formula 13 is that represented by the Formula 1 wherein R1, R2, and R4 are hydrogen atoms, and R3 is a methoxy group. The polymer represented by the Formula 14 is that represented by the Formula 1 wherein R1, R3, and R4 are hydrogen atoms, and R2 is a methylthio group. The polymer represented by the Formula 15 is that represented by the Formula 1 wherein R1, R3, and R4 are hydrogen atoms, and R2 is a t-butyl group (tertiary butyl group).

<Method for Making Organic Electroluminescent Device>

The method for forming the organic electroluminescent device 10 is described below.

Firstly, the anode 12 is formed on the substrate 11. The film of the anode 12 is formed by, for example, vapor deposition, sputtering, ion plating, plating, or coating.

Subsequently, the hole injection layer 13 is formed on the anode 12. Subsequently, the hole transporting layer 14 is formed on the hole injection layer 13. Subsequently, the luminous layer 15 is formed on the hole transporting layer 14. Subsequently, the electron transporting layer 16 is formed on the luminous layer 15. Subsequently, the electron injection layer 17 is formed on the electron transporting layer 16.

The methods for forming the hole injection layer 13, the hole transporting layer 14, the luminous layer 15, the electron transporting layer 16, and the electron injection layer 17 are not particularly limited as long as they can form a thin film. For example, a solution containing the raw material is applied to a desired thickness by spin coating, followed by heat-drying using a hot plate or the like. The solution to be applied may be previously filtered.

<Method for Making the Polymer Expressed by the Formula 2>

The polymer represented by the Formula 2 may be prepared according to the Scheme 16.

Scheme 16

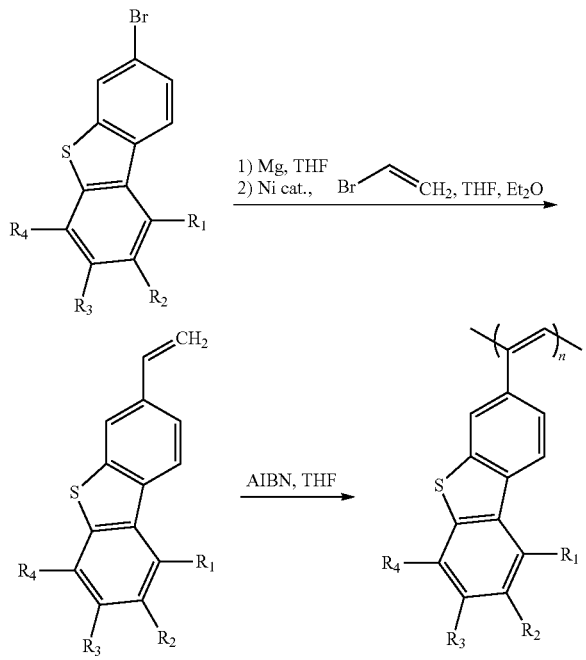

Specifically, the procedure is carried out as follows. All the operations are carried out under flow of Ar gas, and all the solvents used for the reaction are dehydrated solvents. After drying the glassware in a drying oven at 130° C. for 3 hours, the glassware is assembled under flow of Ar from the cock, and allowed to stand overnight. Mg powder (2.3 eq.) is placed in a three-necked flask, which is one of the items of glassware, THF is added thereto, and further half a microspatula of iodine is added, and the mixture is stirred. The liquid turns into a brown color due the presence of iodine, and the Mg powder produces white turbidity. Aside from this, a monobromo derivative of dibenzothiophene (1.0 eq.) is placed in another three-necked flask, THF is added thereto, and the mixture is stirred.

The colorless transparent liquid formed in the flask is sucked up through a syringe, and transferred to the dropping funnel which has been incorporated into the above-described glassware. After dropping several drops from the dropping funnel, the mixture is heated with a dryer, and the brown color of iodine disappears immediately, indicating the formation of a Grignard reagent. Furthermore, the liquid is added at a rate of a drop per second, the temperature inside the flask is increased, and the dropping is continued little by little until the temperature exceeds 50° C.

Thereafter, the flask is heated in an oil bath for about 3.5 hours until the mixture boils. Subsequently, NiCl$_2$ (dppp) (0.013 eq.) is added to a three-necked flask, and then diethyl ether is added thereto. To the flask, a vinyl bromide solution in THF (1.2 eq.) is added, and cooled to 8° C. in an ice bath. To the dropping funnel incorporated into the experiment instrument, the above-described Grignard reagent is transferred together with Mg powder using a transfer (composed of a Teflon (R) tube and a needle).

With cooling in the ice bath under stirring, the Grignard reagent of dibenzothiophene is dropped from the dropping funnel over a period of about 30 minutes at a rate of a drop per second. Thereafter, the ice bath is removed, and stirring is continued with heating in an oil bath at 31° C. After stirring under heating for about 5.5 hours after completion of dropping, stirring is stopped, and the flask is allowed to stand for about 12 hours.

Added to the reaction solution is 0.95 N HCl, after which diethyl ether and water are added. The aqueous phase is extracted five times using chloroform, and the absence of the product is confirmed by TLC. After drying for 1 hour using magnesium sulfate, the drying agent is removed by filtration, and the solvent is evaporated.

Hexane is added to the flask, but is almost insoluble, and chloroform is added to make an orange suspension. Silica gel is added to the suspension, and allowed to support the suspension while the solvent is evaporated. The resultant is subjected to column chromatography (silica gel, hexane alone) for purification. The eluted fractions are evaluated by TLC, and only the fractions likely to contain the target substance are collected, and the solvent is evaporated under reduced pressure, thereby obtaining a vinyl derivative.

Subsequently, a radical polymerization reaction is carried out, and the polymer represented by the Formula 2 is obtained.

Specifically, the following procedure is carried out in an Ar gas flowing atmosphere. All the reaction solvents are dehydrated solvents. A vinyl derivative (1.0 eq.) is placed in a three-necked flask, and dissolved in THF. Aside from this, azobisisobutyronitrile (AIBN), which is a radical polymerization initiator, is placed in a three-necked flask, THF is added and stirred, thus obtaining a homogeneous solution.

From the solution, an AIBN solution (1/268 eq.) is taken using a syringe, and added to a vinyl derivative solution in THF. Thereafter, the pear-shaped flask is heated in an oil bath for 8 hours 20 minutes such that the periphery of the flask is 63° C.

After cooling to room temperature, the reaction solution is dropped to a conical flask containing methanol, purification by reprecipitation is carried out three times, and thus obtaining the desired polymer which is a white solid.

<Method for Preparing P3VDBT>

The P3VDBT represented by the Formula 3 is a novel material.

Firstly, dibenzothiophene brominated at the 3-position was synthesized with reference to a known literature (Milton, L. L. J Heterocyclic Chem. 1985, 22, 215-218).

In the reaction example of a known literature (Shimomura, O.; Sato, T.; Tomita, I.; Suzuki, M.; Endo, T. J. Polym. Sci. part A: Polym Chem. 1997, 35, 2813-2819), the vinylation reaction of dibenzothiophene brominated at the 2-position is mentioned.

With reference to this, as shown by the scheme 17, vinylation of dibenzothiophene brominated at the 3-position was carried out. Specifically, according to the following procedure, the monobromo derivative of dibenzothiophene was allowed to react with Mg in one pot, thereby forming a Grignard reagent. The reagent was allowed to react with a vinyl source in the presence of an Ni catalyst, thereby synthesizing a vinyl derivative (3-vinyldibenzothiophene). The NiCl$_2$ (dppp) used as the Ni catalyst was (1,3-bis[diphenylphosphino]propane)dichloronickel (II).

scheme 17

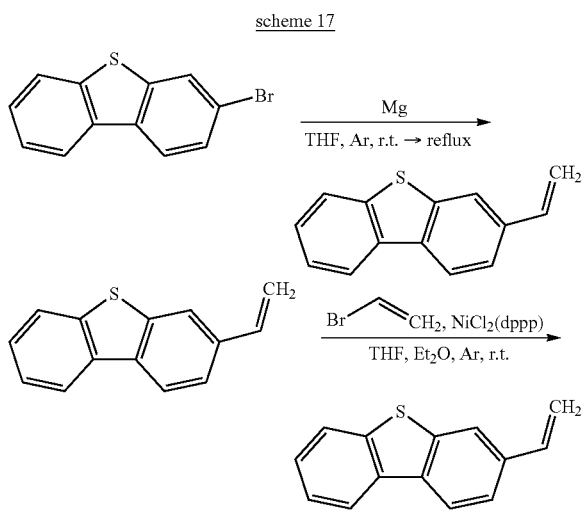

Specifically, the procedure was carried out as follows. All the operations were carried out under flow of Ar gas, and all the solvents used for the reaction were dehydrated solvents. After drying the glassware in a drying oven at 130° C. for 3 hours, the glassware was assembled under flow of Ar from the aspiration cock, and allowed to stand overnight. Mg powder (1.058 g, 43.53 mmol, 2.3 eq.) was placed in a 50 mL three-necked flask, which was one of the items of glassware, 5.0 mL of THF was added thereto, and further half a microspatula of iodine was added, and the mixture was stirred. The liquid turned into a brown color due the presence of iodine, and the Mg powder produced white turbidity.

Aside from this, a monobromo derivative of dibenzothiophene (5.017 g, 19.07 mmol, 1.0 eq.) was placed in another 50-mL three-necked flask, THF (25.0 mL) was added thereto, and the mixture was stirred. The colorless transparent liquid formed in the flask was sucked through a syringe, and transferred to the dropping funnel which had been incorporated into the above-described glassware. After dropping several drops from the dropping funnel, the mixture was heated with a dryer, upon which the brown color of iodine disappeared immediately, indicating the formation of a Grignard reagent.

Furthermore, the liquid was added at a rate of a drop per second, the temperature in the flask was increased, and the dropping was continued little by little until the temperature exceeded 50° C. The dropping was completed in about 13 minutes, and then the flask was heated in an oil bath for about 3.5 hours until the mixture boiled. Subsequently, $NiCl_2$ (dppp) (130 mg, 0.240 mmol, 0.013 eq.) was added to a 100-mL three-necked flask, and then diethyl ether (10 mL) is added thereto.

To the flask, a vinyl bromide solution in THF (1 mol/L, 23.0 mmol, 1.2 eq.) was added, and cooled to 8° C. in an ice bath. To the dropping funnel incorporated into the experiment instrument, the above-described Grignard reagent was transferred together with Mg powder using a transfer (composed of a Teflon (R) tube and a needle).

With cooling in the ice bath under stirring, the Grignard reagent of dibenzothiophene was dropped from the dropping funnel over a period of about 30 minutes at a rate of a drop per second. Thereafter, the ice bath was removed, and stirring was continued with heating in an oil bath at 31° C. After stirring under heating for about 5.5 hours after completion of dropping, stirring was stopped, and the flask was allowed to stand for about 12 hours.

Added to the reaction solution was 0.95 N HCl (10 mL), and further diethyl ether (10 mL) and water were added. The aqueous phase was extracted five times using 20 mL of chloroform, and the absence of the product was confirmed by TLC. After drying for 1 hour using magnesium sulfate, the drying agent was removed by filtration, and the solvent was evaporated.

Hexane was added to the flask, but was almost insoluble, and 100 mL of chloroform was added to make an orange suspension. 16.75 g of silica gel was added to the suspension, and allowed to support the suspension while the solvent was evaporated. The resultant was subjected to column chromatography (silica gel, ϕ60 mm×h:245 mm, hexane alone) for purification.

The eluted fractions were evaluated by TLC, and only the fractions likely to contain the target substance were collected, then the solvent was evaporated under reduced pressure, thereby obtaining a vinyl derivative (2.3188 g, 11.026 mmol). The yield was 58%.

Figure 8:
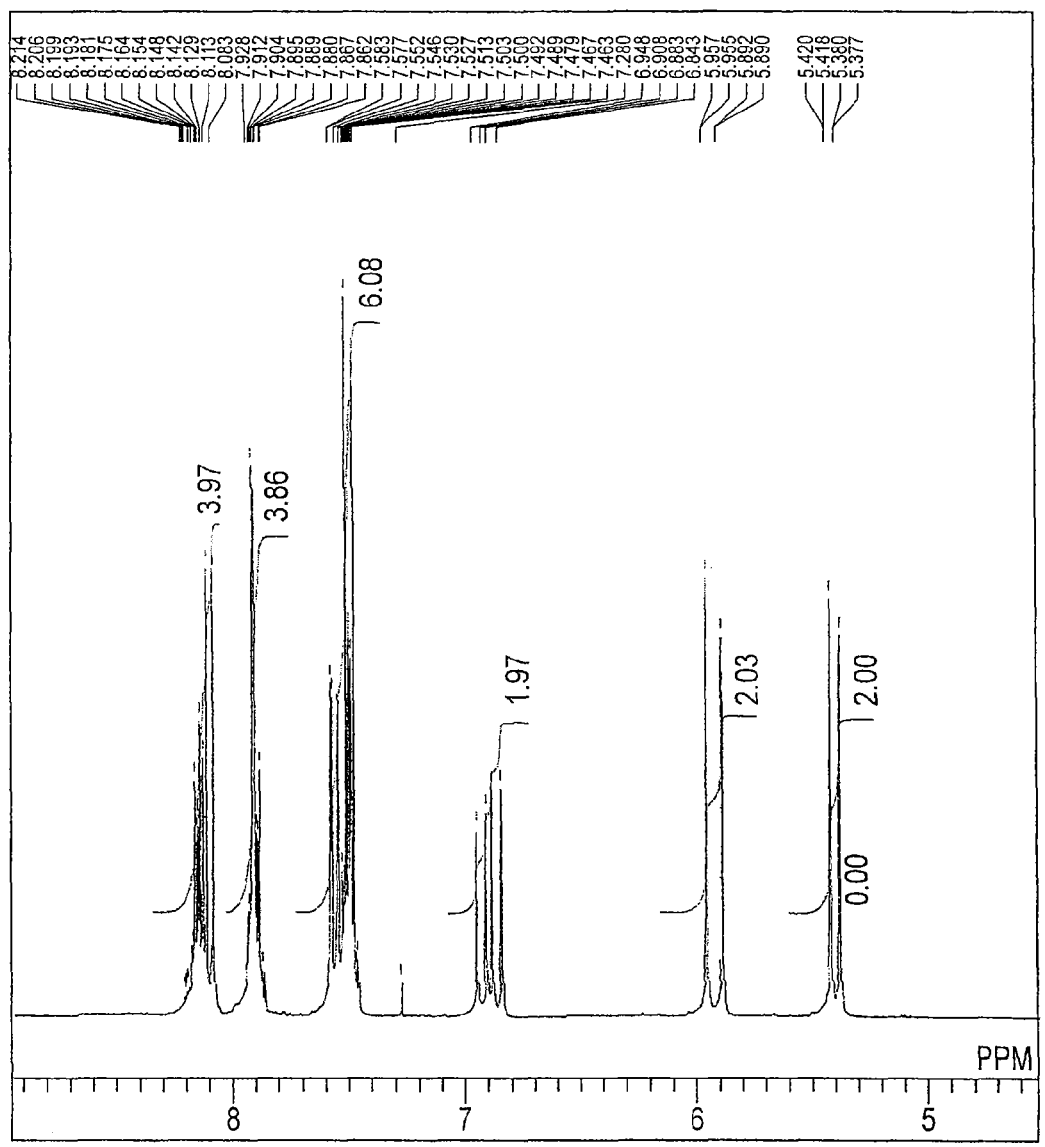
FIG. 8 shows the 1H NMR spectrum of the dibenzothiophene vinylated at the 3-position.

FIG. 8 shows the result of measurement by $^1$H NMR spectrum. The two doublet peaks in the vicinity of 5.3-6.0 ppm and the four peaks in the vicinity of 6.8-7.0 ppm are peaks attributable to vinyl groups. In addition, the peaks at 7.4-8.2 ppm are attributable to the aromatic ring of dibenzothiophene. From these facts, the object was confirmed to be the target substance. In addition, the absence of other impurities was also confirmed.

Subsequently, as shown by the scheme 18, a radical polymerization reaction of 3-vinyldibenzothiophene was carried out, thereby obtaining P3VDBT.

scheme 18

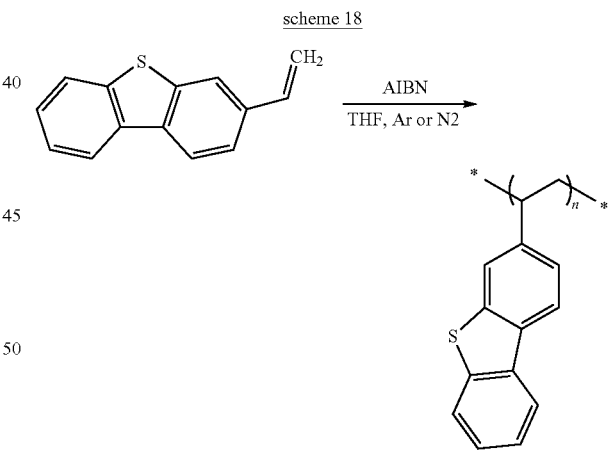

Specifically, the following procedure was carried out in an Ar gas flowing atmosphere. All the reaction solvents were dehydrated solvents. 3-vinyldibenzothiophene (1.016 g, 4.831 mmol, 1.0 eq.) was placed in a 10-mL three-necked flask, and dissolved in THF (4 mL). Aside from this, azobisisobutyronitrile (AIBN), which is a radical polymerization initiator, was placed in a 50-mL three-necked flask, THF (19 mL) was added and stirred, thus obtaining a homogeneous solution.

From the solution, an AIBN solution (5.0 mL, 0.018 mmol, 1/268 eq.) was taken using a syringe, and added to a 3-vinyldibenzothiophene solution in THF. Thereafter, the pear-shaped flask was heated in an oil bath for 8 hours 20 minutes such that the periphery of the flask was 63° C.

After cooling to room temperature, the reaction solution was dropped to a 200-mL conical flask containing 100 mL of methanol, purification by reprecipitation was carried out three times, thus obtaining a white solid (275.6 mg). The yield was 27%, based on the weight of the raw material.

Figure 9:
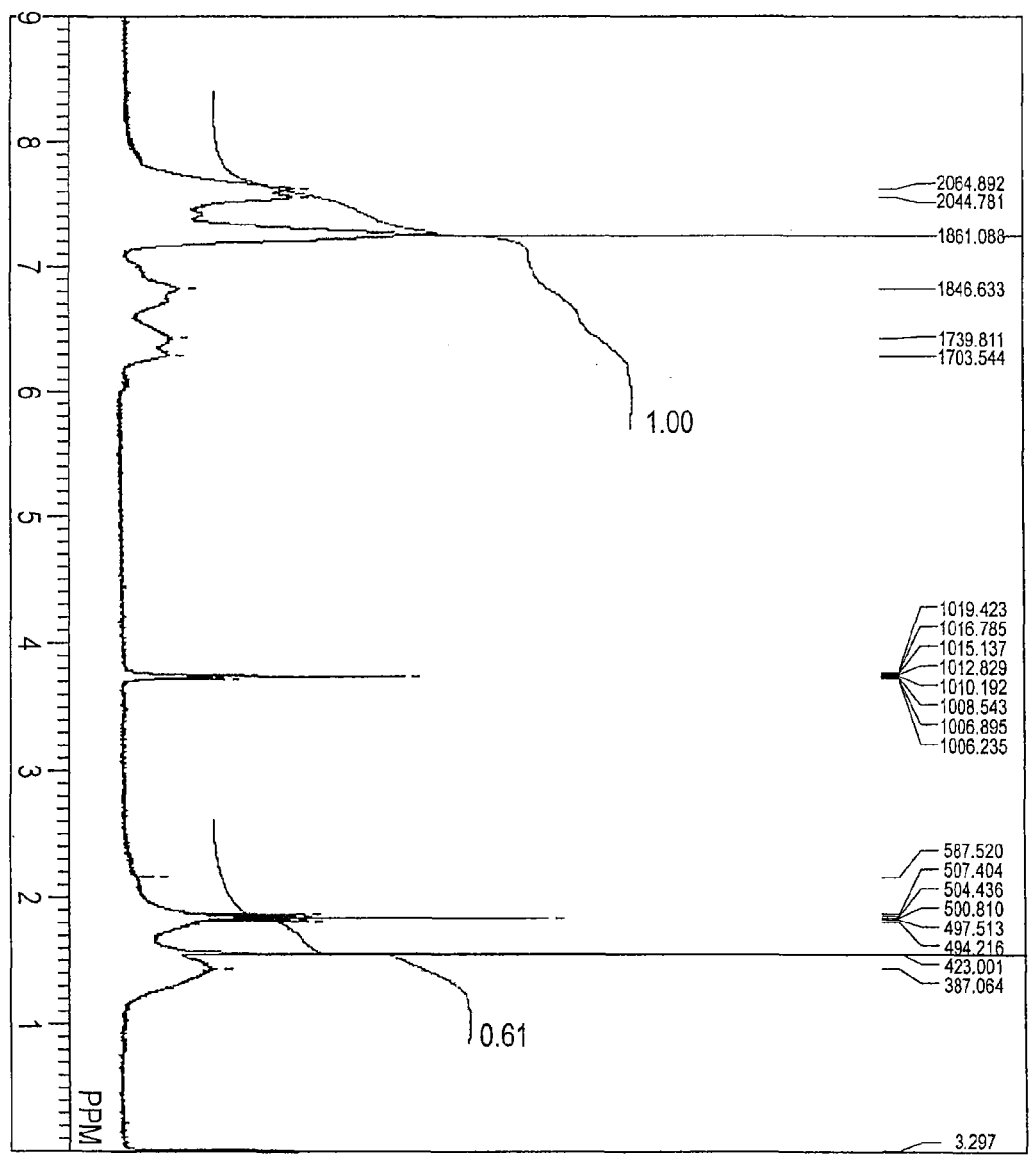
FIG. 9 shows the 1H NMR spectrum of P3VDBT.

FIG. 9 shows the 1H NMR spectrum of the polymer thus obtained. Regarding the region of chemical shift attributable to the aromatic ring, a broad peak was found, and peaks attributable to the raw material and others were not found. The multiplet peaks at 1.8 ppm and 3.8 ppm are likely attributable to THF. The peaks at 7.3 ppm and 1.5 ppm are likely the chloroform for NMR measurement, and water contained therein. The small peaks at 2.2 ppm and 1.4 ppm are likely spinning side bands, based on their positions.

Figure 10:
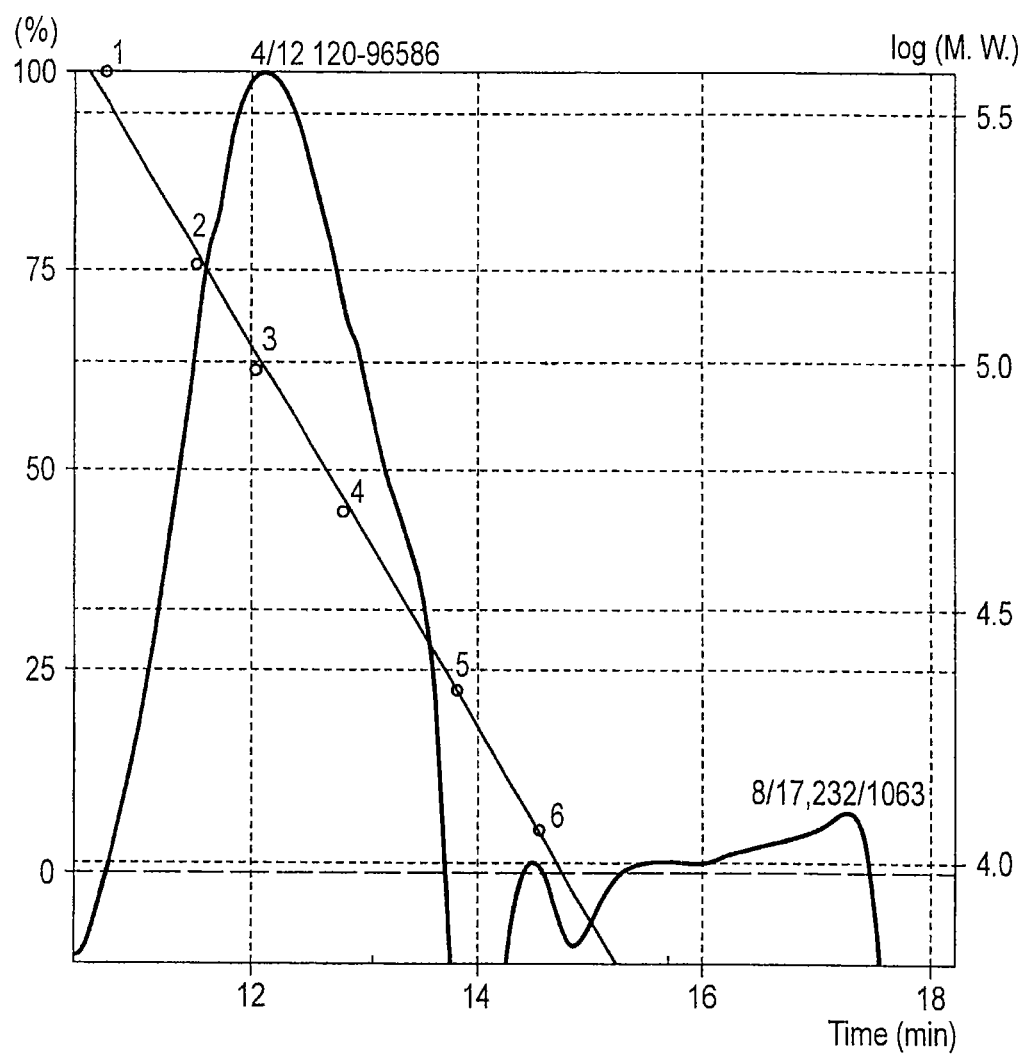
FIG. 10 shows the GPC spectrum of P3VDBT.

FIG. 10 shows the result of GPC measurement using THF as the developing solvent. Peaks appeared at similar positions as in the 1H NMR spectrum. The P3VDBT thus obtained had a number-average molecular weight (Mn) of 72000, a weight-average molecular weight (Mw) of 126000, and a degree of polymerization (Mw/Mn) of 1.75.

(Second Embodiment)

Figure 11:
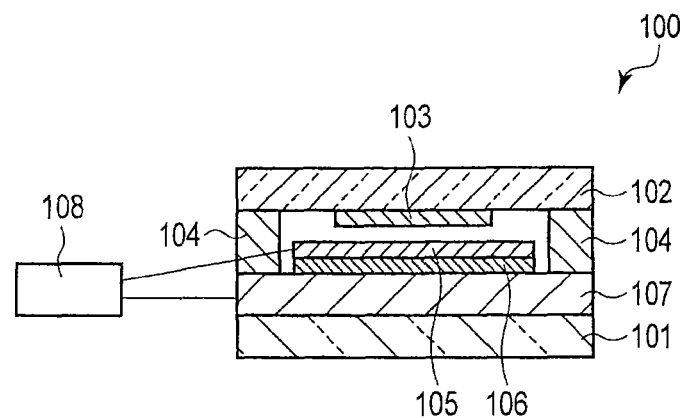
FIG. 11 is a cross sectional view showing the illumination apparatus.

FIG. 11 is a cross sectional view showing the illumination apparatus according to the second embodiment. An illumination apparatus 100 includes a laminated anode 107, an organic layer 106, a cathode 105, and a driving unit 108 electrically connected to the anode 107 and cathode 105. The illumination apparatus 100 may further include a glass substrate 101 provided below the anode 107, a sealing glass 102 for covering the cathode 105, and an adhesive 104 for fixing the sealing glass 102 to the anode 107. In addition, a drying agent 103 may be placed on the cathode 105 side of the sealing glass 102.

The organic layer 106 includes the luminous layer 15. The luminous layer 15 is composed of a host material made of an organic material which is doped with a luminescent material (hereinafter referred to as luminescent dopant). In the present embodiment, the host material is a material containing the polymer having the dibenzothiophene skeleton represented by the Formula 1 in the repeating unit.

More specifically, the anode 107, organic layer 106, and cathode 105 compose the organic electroluminescent device 10 according to the first embodiment.

The organic layer 106 may further include the hole injection layer 13, hole transporting layer 14, luminous layer 15, electron transporting layer 16, and electron injection layer 17.

The illumination apparatus 100 according to the present embodiment has a long life and high brightness.

(Third Embodiment)

Figure 12:
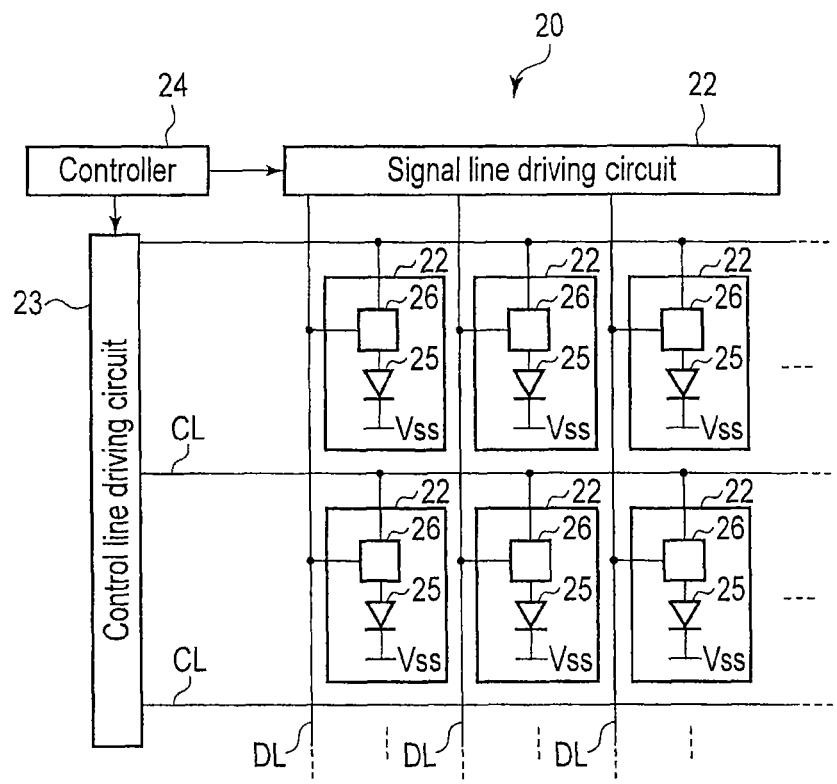
FIG. 12 is a circuit diagram showing the display.

FIG. 12 is a circuit diagram showing the display according to one embodiment. A display 20 has a circuit in which lateral control lines (CL) and vertical signal lines (DL) are arranged in a matrix, each region containing a pixel 21. The pixel 21 contains a light emitting element 25 and a thin film transistor (TFT) 26 connected to the light emitting element 25. One terminal of the TFT 26 is connected to the control line, and the other terminal is connected to the signal line. The signal line is connected to a signal line driving circuit 22. A driving unit for driving the pixel is provided around the region having the pixel 21. The driving unit contains the signal line driving circuit 22, a control line driving circuit 23, and a controller 24. The signal line is connected to the signal line driving circuit 22. The control line is connected to the control line driving circuit 23. The signal line driving circuit 22 and control line driving circuit 23 are controlled by the controller 24.

The light emitting element 25 is the organic electroluminescent device 10 according to the first embodiment.

The display 20 according to the present embodiment has a long life and high brightness.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic electroluminescent device comprising:

an anode;

a cathode provided apart from the anode; and a luminous layer disposed between the anode and the cathode and comprising a host material and a luminous dopant, the host material comprising at least one polymer selected from the group consisting of

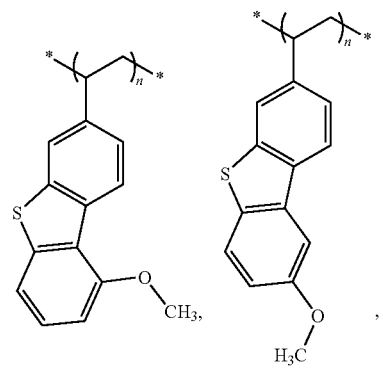

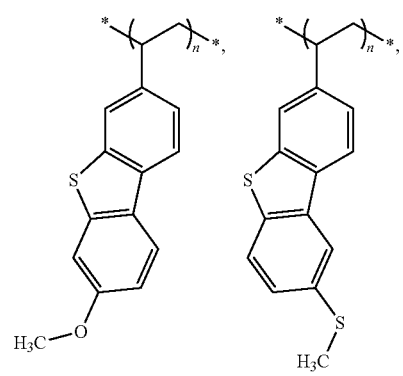

-continued

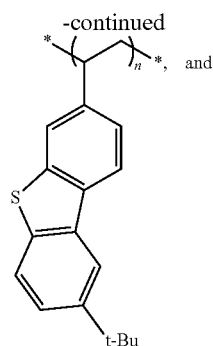, and wherein n is from 20 to 10,000.

2. The organic electroluminescent device according to claim 1, wherein n is 100 to 5,000.

3. An illumination apparatus comprising:
the organic electroluminescent device according to claim 1; and
a driving unit driving the organic electroluminescent device.

4. A display comprising:
the organic electroluminescent device according to claim 1; and
a driving unit driving the organic electroluminescent device.

5. The organic electroluminescent device according to claim 1, wherein the host material comprises:

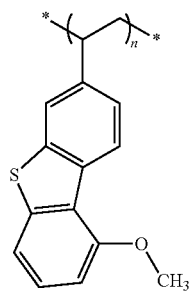

wherein n is from 20 to 10,000.

6. The organic electroluminescent device according to claim 1, wherein the host material comprises:

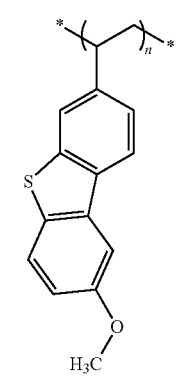

wherein n is from 20 to 10,000.

7. The organic electroluminescent device according to claim 1, wherein the host material comprises:

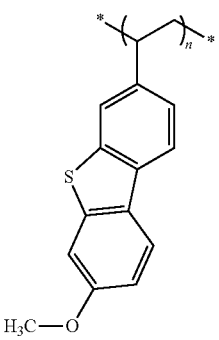

wherein n is from 20 to 10,000.

8. The organic electroluminescent device according to claim 1, wherein the host material comprises:

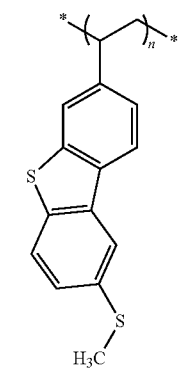

wherein n is from 20 to 10,000.

9. The organic electroluminescent device according to claim 1, wherein the host material comprises:

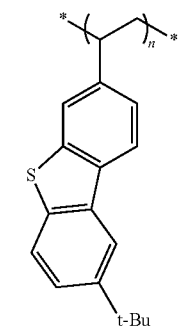

wherein n is from 20 to 10,000.

10. A host material comprising at least one polymer selected from the group consisting of

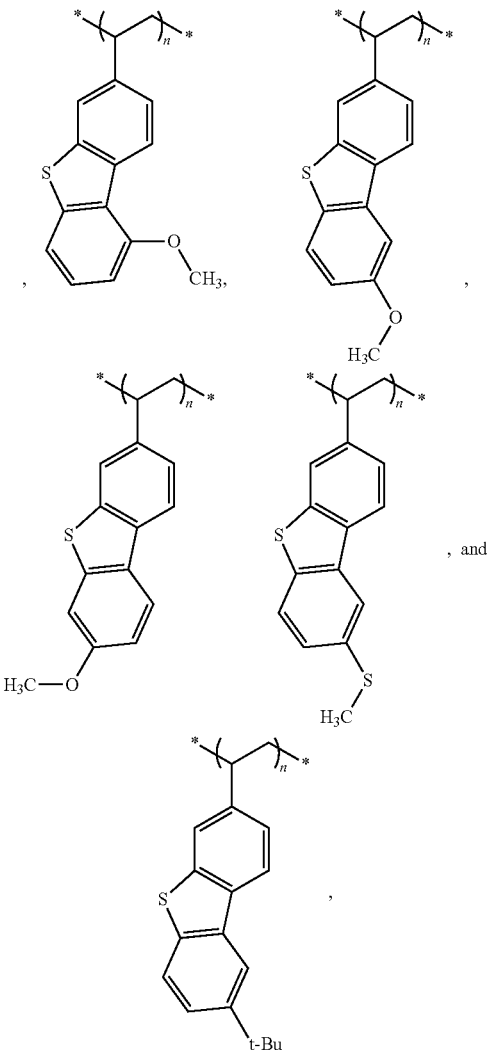

,

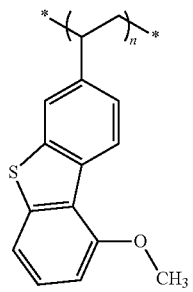

wherein n is from 20 to 10,000.

11. The host material according to claim 10, wherein n is 100 to 5,000.

12. The host material according to claim 10, wherein a number-average molecular weight of the polymer is 20,000 to 1,000,000.

13. The host material according to claim 10, which comprises:

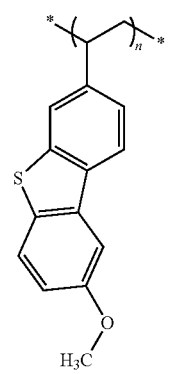

wherein n is from 20 to 10,000.

14. The host material according to claim 10, which comprises:

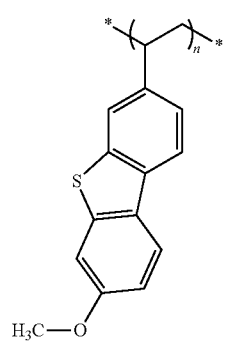

wherein n is from 20 to 10,000.

15. The host material according to claim 10, which comprises:

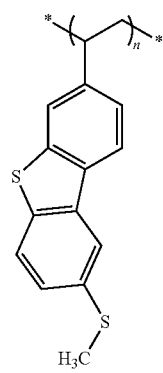

wherein n is from 20 to 10,000.

16. The host material according to claim 10, which comprises:

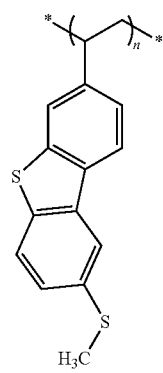

wherein n is from 20 to 10,000.

17. The host material according to claim 10, which comprises:
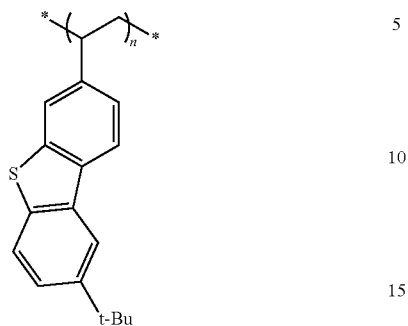
wherein n is from 20 to 10,000.
* * * * *